(12) United States Patent
Weiler et al.

(10) Patent No.: US 10,611,961 B2
(45) Date of Patent: Apr. 7, 2020

(54) SUPERTETRAHEDRON PHOSPHOR FOR SOLID-STATE LIGHTING

(71) Applicant: Lumileds LLC, San Jose, CA (US)

(72) Inventors: Volker Weiler, Aachen (DE); Peter Josef Schmidt, Aachen (DE); Philipp Alexander Hubert Pust, Aachen (DE); Wolfgang Schnick, Gauting (DE)

(73) Assignee: LUMILEDS LLC, San Jose, CA (US)

( * ) Notice: Subject to any disclaimer, the term of this patent is extended or adjusted under 35 U.S.C. 154(b) by 743 days.

(21) Appl. No.: 15/123,927

(22) PCT Filed: Mar. 10, 2015

(86) PCT No.: PCT/EP2015/054868
§ 371 (c)(1),
(2) Date: Sep. 6, 2016

(87) PCT Pub. No.: WO2015/135888
PCT Pub. Date: Sep. 17, 2015

(65) Prior Publication Data
US 2017/0015902 A1    Jan. 19, 2017

(30) Foreign Application Priority Data
Mar. 13, 2014  (EP) .................................. 14159384

(51) Int. Cl.
*C09K 11/77* (2006.01)
*C09K 11/08* (2006.01)
(Continued)

(52) U.S. Cl.
CPC ........ *C09K 11/7792* (2013.01); *C09K 11/025* (2013.01); *C09K 11/0883* (2013.01);
(Continued)

(58) Field of Classification Search
CPC ............ C09K 11/7734; C09K 11/0883; C09K 11/7792; C09K 11/7721; C09K 11/025;
(Continued)

(56) References Cited

U.S. PATENT DOCUMENTS

2003/0094893 A1  5/2003  Ellens et al.
2010/0244076 A1  9/2010  Schmidt et al.
(Continued)

FOREIGN PATENT DOCUMENTS

CN  102391861 A  3/2012
CN  103003390 A  3/2013
(Continued)

OTHER PUBLICATIONS

EPO as ISA, International Search Report and Written Opinion dated Jun. 17, 2015 from International Application No. PCT/EP2015/054868, filed Mar. 10, 2015, 11 pages.
(Continued)

*Primary Examiner* — Matthew E. Hoban
*Assistant Examiner* — Lynne Edmondson

(57) ABSTRACT

The invention provides a lighting unit (100) comprising a light source (10), configured to generate light source light (11) and a luminescent material (20), configured to convert at least part of the light source light (11) into luminescent material light (51), wherein the luminescent material (20) comprises a phosphor (40), wherein this phosphor comprises an alkaline earth aluminum nitride based material having a cubic crystal structure with T5 supertetrahedra, wherein the T5 supertetrahedra comprise at least Al and N, and wherein the alkaline earth aluminum nitride based material further comprises a luminescent lanthanide incorporated therein.

15 Claims, 9 Drawing Sheets

(51) Int. Cl.
| | | |
|---|---|---|
| *C09K 11/02* | (2006.01) | |
| *H01L 33/50* | (2010.01) | |
| *G02F 1/1335* | (2006.01) | |
| *C09K 11/65* | (2006.01) | |

(52) U.S. Cl.
CPC ........ *C09K 11/655* (2013.01); *C09K 11/7721* (2013.01); *C09K 11/7734* (2013.01); *G02F 1/133603* (2013.01); *H01L 33/502* (2013.01)

(58) Field of Classification Search
CPC .. C09K 11/08; H01L 33/502; G02F 1/133603
USPC .................................... 252/301.4 F, 301.4 R
See application file for complete search history.

(56) References Cited

U.S. PATENT DOCUMENTS

| | | |
|---|---|---|
| 2012/0019126 A1 | 1/2012 | Porob et al. |
| 2012/0162573 A1 | 6/2012 | Takahashi et al. |
| 2017/0314745 A1* | 11/2017 | Schmidt ............. C09K 11/7734 |

FOREIGN PATENT DOCUMENTS

| | | | |
|---|---|---|---|
| CN | 101883835 B | 5/2013 | |
| EP | 2036966 A1 | 3/2009 | |
| EP | 2671938 A1 | 12/2013 | |
| JP | 2012-177030 A | 9/2012 | |
| WO | 2013175336 A1 | 11/2013 | |
| WO | WO-2013175336 A1 * | 11/2013 | ......... C09K 11/0883 |

OTHER PUBLICATIONS

Li et al., "Optical Properties of Green-Blue-Emitting Ca-α-Sialon:Ce3+, Li+ Phosphors for White Light-Emitting Diods (LEDs)", Journal of Solid State chemistry, vol. 184, No. 5, Mar. 5, 2011, pp. 1036-1042.

Tapia-Ruiz et al., The Chemistry of Ternary and Higher Lithium Nitrides, Coordination Chemistry Reviews, vol. 257, No. 13, Nov. 24, 2012, pp. 1978-2014.

Extended European Search Report dated Aug. 25, 2014, European Patent Application No. 14159384.8, 10 pgs.

Avci, et al. "Microencapsulation of Moisture-Sensitive CaS:Eu2+ Particles with Aluminum Oxide", Journal of the Electrochemical Society, (2009) 156 (11), pp. J333-J3337.

Cho, et al. "Control of AlPO4-nanoparticle coating on LiCoO2 by using water or ethanol", Electrochimica Acta 50 (2005) pp. 4182-4187.

Li, et al. "Low-Temperature Crystallization of Eu-Doped Red-Emitting CaAlSiN3 from Alloy-Derived Ammonometallates", Chemistry of Materials 19 (2007), pp. 3592-3594.

Moller, et al. "The First T5-Supertetrahedron in Oxide Chemistry: Na26Mn39O55", Z. Anorg. Allg. Chem. (2004), vol. 630, pp. 890-894.

Scheu, et al. "Electron Energy-Loss Near-Edge Structure of Metal-Alumina Interfaces", Microscopy. Microanalysis. Microstructures, 6 (1995), pp. 19-31.

Watanabe, et al. "Synthesis of Sr0.99Eu0.01AlSiN3 from intermetallic precursor", Journal of the Ceramic Society of Japan, (2009), 117, pp. 115-119.

Zuener, et al. "Li2CaSi2N4 and Li2SrSi2N4—a Synthetic Approach to Three-Dimensional Lithium Nitridosilicates", European Journal Inorganic Chemistry, (2010), pp. 4945-4951.

First Office Action dated Mar. 29, 2018, China Patent Application No. 201580013718.7, 12 pages.

* cited by examiner

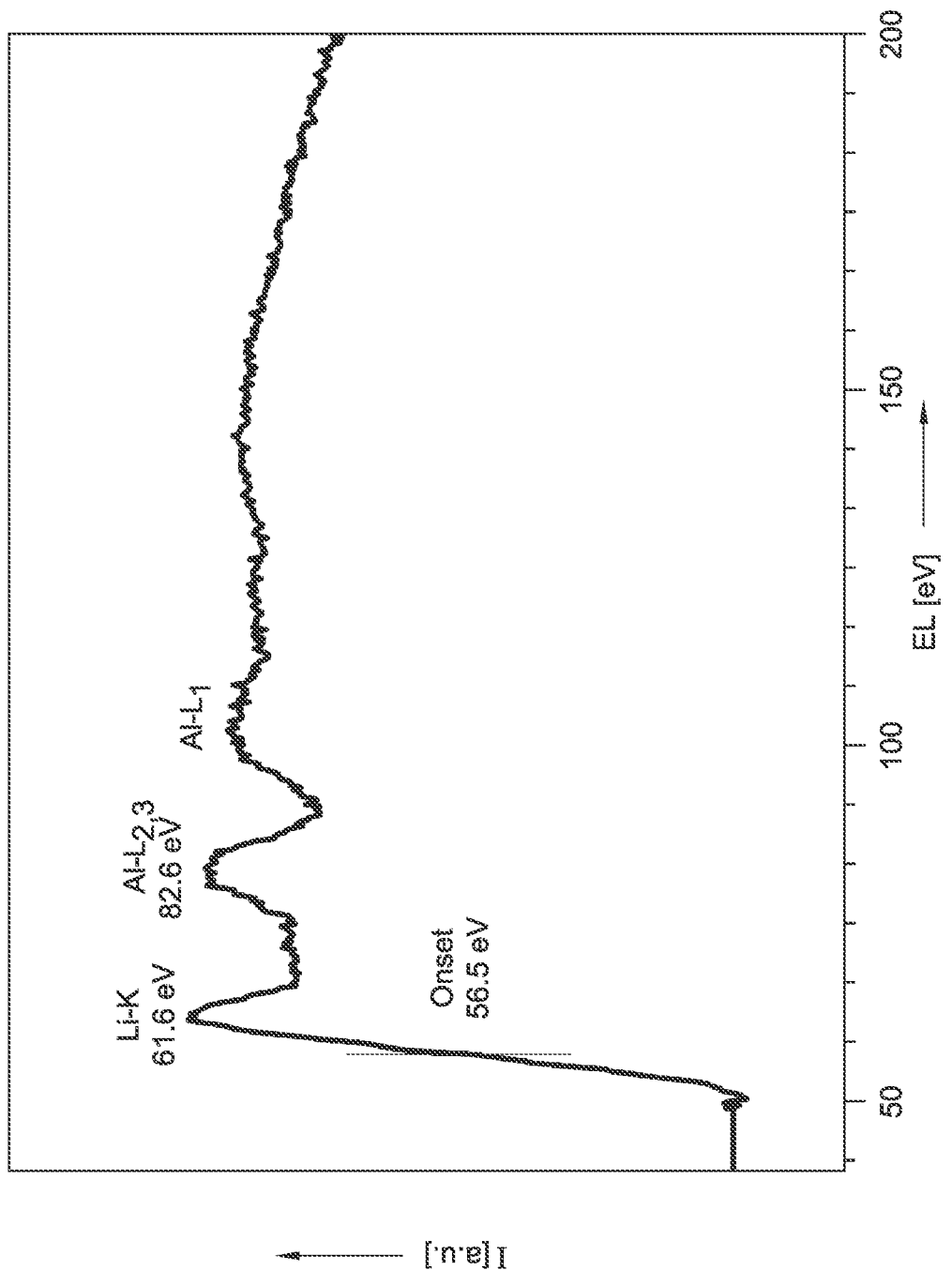

SUPERTETRAHEDRON PHOSPHOR FOR SOLID-STATE LIGHTING

CROSS-REFERENCE TO RELATED APPLICATIONS

The present application is a § 371 application of International Application No. PCT/EP2015/054868 filed on Mar. 10, 2015 and entitled "SUPERTETRAHEDRON PHOSPHOR FOR SOLID-STATE LIGHTING," which claims priority to European Patent Application No. 14159384.8, filed Mar. 13, 2014. Applications PCT/EP2015/054868 and EP14159384.8 are incorporated herein.

FIELD OF THE INVENTION

The invention relates to a class of new phosphors, as well as individual members thereof, and to a lighting unit comprising one or more of such phosphors, and optionally one or more other phosphors, for generating luminescence.

BACKGROUND OF THE INVENTION

Nitride and/or oxynitride luminescent materials are known in the art, including those emitting in the red. US2003094893, for instance, describes an illumination unit having at least one LED as light source, the LED emitting primary radiation in the range from 300 to 570 nm, this radiation being partially or completely converted into longer-wave radiation by phosphors which are exposed to the primary radiation of the LED, in which unit the conversion takes place at least with the aid of a nitride-containing phosphor which emits with a peak emission wavelength at 430 to 670 nm and which originates from the class of the Ce- or Eu-activated nitrides, oxynitrides or sialons.

WO2013175336 describes, amongst others for application in a lighting unit, a phosphor having the formula $M_{1-x-y-z}Z_zA_aB_bC_cD_dE_eN_{4-n}O_n:ES_xRE_y$ (I), with M=selected from the group consisting of Ca, Sr, and Ba; Z=selected from the group consisting of monovalent Na, K, and Rb; A=selected from the group consisting of divalent Mg, Mn, Zn, and Cd; B=selected from the group consisting of trivalent B, Al and Ga; C=selected from the group consisting of tetravalent Si, Ge, Ti, and Hf; D=selected from the group consisting of monovalent Li, and Cu; E=selected for the group consisting of P, V, Nb, and Ta; ES=selected from the group consisting of divalent Eu, Sm and Yb; RE=selected from the group consisting of trivalent Ce, Pr, Nd, Sm, Eu, Gd, Tb, Dy, Ho, Er, and Tm; $0 \leq x \leq 0.2$; $0 \leq y \leq 0.2$; $0 < x+y \leq 0.4$; $0 \leq z < 1$; $0 \leq n \leq 0.5$; $0 \leq a \leq 4$ (such as $2 \leq a \leq 3$); $0 \leq b \leq 4$; $0 \leq c \leq 4$; $0 \leq d \leq 4$; $0 \leq e \leq 4$; $a+b+c+d+e=4$; and $2a+3b+4c+d+5e=10-y-n+z$.

SUMMARY OF THE INVENTION

Current phosphor converted (pc) LED solutions suffer either from lacking intensity in the red spectral region, which forbids the manufacture of warm white devices (CCT<5000K) and limits colour rendition properties or they have to use phosphors which have a substantial portion of the emitted energy at wavelengths >650 nm and hamper the luminous efficiency (lm/W) of such devices due to the limited eye sensitivity in the deep red spectral region. These state-of-the-art phosphors are usually band emitting materials based on activation by Eu(II)(divalent europium or $Eu^{2+}$). With this activator spectral bandwidth expressed as the full width half maximum (FWHM) of the emission spectrum is often well over 2000 $cm^{-1}$, such as at least 2760 $cm^{-1}$ and higher at the needed emission wavelengths. Thus for pcLEDs luminescent materials with narrow band emission in the red spectral region are very desirable as they will offer increased spectral efficiency for illumination purposes. In displays such materials with saturated red colour points lead to a wider colour gamut if used e.g. in LEDs for LCD backlights.

In generally, state-of-art red-emitting phosphors, like (Sr, Ca)$AlSiN_3$:Eu based on activation by Eu(II), result in a broad emission with a FWHM of about 2140 $cm^{-1}$ and higher. As a result, these phosphors hamper the luminous efficiency (lm/W) of pcLEDs due to the limited eye sensitivity in the deep red spectral region.

There is still a need for obtaining good inorganic luminescent materials that can replace or supplement existing luminescent materials, such as for solid state lighting, for instance because of better efficiency or other advantageous luminescent properties like excitation and/or emission band position and/or emission bandwidth. Hence, it is an aspect of the invention to provide an alternative phosphor, especially an alternative green-yellow phosphor, which preferably further at least partly obviates one or more of above-described drawbacks, which preferably absorbs well in the blue and/or UV, especially in the blue, and/or which efficiently converts the absorbed light into visible light, especially red light. However, other colors (in the visible) may be of interest as well, like cyan or orange. It is further an aspect to provide an alternative lighting unit, configured to use such alternative phosphor (for instance as luminescent material, optionally in combination with other phosphors).

Surprisingly, a complete new class of phosphors was found based on T5 supertetrahedra, wherein especially (doping with) divalent Europium may lead to efficient luminescent materials. The invented luminescent materials are especially further characterized by forming a cubic crystal structure that consists of characteristic T5 supertetrahedra ($E_{35}X_{56}$ with E especially selected from the group Al, Mg, Zn, Si, Mn, and B, and X especially selected from the group N and O, as being the main host lattice building blocks). A similar T5-superhedra structure with the formula $Na_{26}Mn_{39}O_{55}$ is described by Möller et al. (Z. Anorg. Allg. Chem. 2004, vol. 630, 890-894), which structure was obtained from a redox reaction between manganese metal and CdO in the presence of $Na_2O$ and $Na_2SO_4$. This publication is incorporated herein by reference. The indication "T5" indicates that the supertetrahedron comprises edges with five tetrahedra. Adjacent tetrahedra (in such supertetrahedron) share a corner.

Hence, in a first aspect the invention provides a lighting unit comprising a light source, configured to generate light source light and a luminescent material, configured to convert at least part of the light source light into luminescent material light, wherein the light source comprises a light emitting diode (LED), or optionally (or additionally) another light source, and wherein the luminescent material comprises a phosphor, wherein this phosphor comprises an alkaline earth aluminum nitride based material having a cubic crystal structure with T5 supertetrahedra, wherein the T5 supertetrahedra comprise at least Al and N, and wherein the alkaline earth aluminum nitride based material further comprises a luminescent lanthanide incorporated therein. This phosphor is (thus) especially configured to convert at least part of the light source light into luminescent material light, especially in the red with a narrow bandwidth when divalent Europium is applied.

Further, in a second aspect the invention provides such phosphor per se, especially a phosphor comprising an alkaline earth aluminum nitride based material having a cubic crystal structure with T5 supertetrahedra, wherein the T5 supertetrahedra comprise at least Al and N, and wherein the alkaline earth aluminum nitride based material further comprises a luminescent lanthanide (ion) incorporated therein.

In contrast to many prior art solutions and compared to commercially available luminescent materials, the invented new materials doped with divalent Europium surprisingly show significant narrower band emission with e.g. a FWHM of about 1140 cm$^{-1}$ at an emission maximum of 650 nm. Hence, the invented phosphor emits a narrow emission band centered at approximately 650 nm and lower depending on the Eu(II)-doping level. The lowest lying broad absorption band is located at the 400 to 500 nm region. The FWHM of the emission band is in the range of about 1140 cm$^{-1}$ and higher (also depending on the Eu(II)-doping level). The structure of the compound is based on T5 supertetrahedra. Absorption in the UV and blue is efficient, providing these materials the opportunity to be used in solid state applications based on a UV and/or blue emitting LED. Hence, herein divalent europium based phosphors are provided having an emission in the red and especially the emission band (in the red) has a FWHM of less than 2000 cm$^{-1}$, especially less than 1500 cm$^{-1}$, such as less than 1250 cm$^{-1}$.

Especially, the alkaline earth aluminum nitride based material crystallizes in the space group Fd-3m (space group number 227) as defined by the International Union of Crystallography. This is a cubic crystal system. As indicated above, the alkaline earth aluminum nitride based material comprises T5 supertetrahedra. This especially indicates that tetrahedra are interconnected to form larger tetrahedra, in this case based on tetrahedra having faces with edges of five tetrahedra on a row. The supertetrahedra especially comprise on $\{G_gQ_qD_dN_{55-n-c}R_nC_c\}$ elements (G, Q, D, R and g, q, d, n, c are explained below). More general, the supertetrahedra especially comprise chemical structures with $E_{39}X_{55}$ elements (with E selected from e.g. Al, Mg, Zn, Si, Mn, and B, and with X selected from e.g. N and O). This may especially be due to the connection of the $[E_{35}X_{56}]$ T5 tetrahedra with $[E_2X]$ dimers according to $[E_2X]_2[E_{35}X_{52+4/4}]=E_{39}X_{55}$ (see e.g. Möller et al.). Especially, each tetrahedron of the T5 supertetrandra comprise at least Al and N. Even more especially, the T5 supertetrahedra comprise AlN$_4$ tetrahedra. Hence, one or more, especially substantially all tetrahedra included by the T5 supertetrahedra are AlN$_4$ tetrahedra. T5 supertetrahedra comprising at least Al and N appear to provide best (optical) results. Hence, in an embodiment all 35 tetrahedra of the supertetrahedron are AlN$_4$ tetrahedra. However, other options, wherein e.g. partly Al is replaced by Ga and/or B, or wherein Al is at least partly replaced by Si may (thus) also be possible.

In a specific embodiment, the alkaline earth aluminum nitride based material comprises:

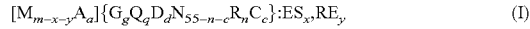

$$[M_{m-x-y}A_a]\{G_gQ_qD_dN_{55-n-c}R_nC_c\}:ES_x,RE_y \qquad (I)$$

wherein:

M comprises one or more selected from the group consisting of Ca, Sr, Mg, Ba; A comprises one or more selected from the group consisting of Li, Na; G comprises one or more selected from the group consisting of Al, Ga, B; Q comprises one or more selected from the group consisting of Mg, Mn, Zn; D comprises one or more selected from the group consisting of Si, Ge; R comprises one or more selected from the group consisting of O, S; ES comprises one or more selected from the group consisting of Eu, Yb, Sm; RE comprises one or more selected from the group consisting of Ce, Pr, Nd, Sm, Eu (III), Gd, Tb, Dy, Ho, Er, Tm;

$0 \le m \le 30$; especially $10 \le m \le 30$; such as especially $16 \le m \le 30$;

$0 \le x \le 2$, especially $0.005 \le x \le 2$, even more especially $0.05 \le x \le 2$; $0 \le y \le 1$, especially; $0.01 \le y \le 1$; $0 < x+y \le 3$;

$0 < g \le 39$; especially $30 \le g \le 39$, even more especially $30 \le g \le 39$;

$0 \le q \le 5$; such as $0 \le q \le 4$;
$0 \le d \le 12$; such as $0 \le d \le 4$; such as 0;
$0 \le n \le 5$; such as $0 \le n \le 2$; such as 0;
$0 \le c \le 12$; such as $0 \le c \le 4$; such as 0;
$26 \le m+a \le 30$; $g+q+d=39$; and $2(m+q)+3(y+g)+a+4d=165-n+c$.

The last three equations are especially used to define the cubic T5 supertetrahedra based system. The equation $26 \le m+a \le 30$ indicates the site occupation, which was derived from structure refinements. The equation $g+q+d=39$ indicates the number of tetrahedra that build up the T5 supertetrahedron host lattice structure (35) together with the interlinking dimeric tetrahedron units (2×2). Further, the equation $2(m+q)+3(y+g)+a+4d=165-n+c$ defines the charge neutrality. Equation $0<x+y\le3$ indicates that at least one of ES and RE is available. Phrases like "M comprises one or more selected from the group consisting of Ca, Sr, Mg, Ba" and similar phrases indicate that of the specific M type elements (or M type ion(s)), all M type elements available in the phosphor are selected from Ca, Sr, Mg, and Ba. Hence, all M may be Ca, or all M may be Sr, but also part of M may be Ca and the remaining part may be Mg, etc. Especially, M at least comprises Ca. C in the formula refers to carbon. Hence, the phrase "M comprises one or more selected from the group consisting of Ca, Sr, Mg, Ba" and the phrase "M=Ca, Sr, Mg, Ba" imply thus substantially identical and indicate that M may comprise Ca or Sr, or Mg or Ba, or a combination of two or more of these elements. Likewise, this applies to similar phrase used herein, such as "G comprises one or more selected from the group consisting of Al, Ga, B". Hence, the latter phrase indicates that G may comprise Al, Ga, or B or a combination of two or more of Al, Ga or B. As indicated above, G especially comprises Al. This means that G may comprise one or more of Al, Ga, and B, but at least comprises Al. Hence, the phrases "G comprises Al" or "G comprises at least Al" and similar phrases imply that G comprises Al and optionally e.g. one or more of Ga and B. In a specific embodiment G=Al; then, G essentially consists of Al. Note however that also impurities may be available, as will be known to a person skilled in the art. For instance, even a pure Ba variant, i.e. M=Ba, may include some Sr and/or Ca and/or M, because of the impurity of starting materials. The same applied to the presence of europium, which even in high purity forms such as 5N may include e.g. some other lanthanide elements. The use of such formulas and the presence of impurities in compounds described by such formulas is known to the person skilled in the art.

If Mg is substituted on an M site the coordination number is 6 while it has a 4-fold coordination when it is incorporated on a Q site in the supertetrahedra structure block. ES is a divalent cation e.g. Sm$^{2+}$ and/or Eu$^{2+}$, while RE is a tetravalent cation e.g. Sm$^{3+}$ or Eu$^{3+}$, respectively. In general, the divalent lanthanide ions that can also be trivalent lanthanide ions will be in the divalent state when M is available and when synthesis is done in a reducing or inert atmosphere, as the divalent lanthanide ion may occupy such M site in the crystal lattice. Hence, in general the lanthanide ion will substantially be available in only one state, especially substantially only divalent europium or divalent samarium or divalent ytterbium, when one more of these lanthanides are available. Hence, in an embodiment ES comprises one or more selected from the group consisting of Eu, Yb, Sm and RE does not comprise one or more selected from the group consisting of Eu, Yb, Sm, respectively. Hence, in a specific embodiment, the synthesis conditions of the phosphor may be inert or reducing when one or more of the divalent ions Eu, Yb and Sm are desired. The same applies when the trivalent cerium and/or trivalent terbium is desired.

The A element(s) can be used to compensate for charge neutrality when a trivalent lanthanide, such as CeIII, is incorporated (which especially replaces (partially) an M element). Especially, A may comprise at least Li. Reference a is especially in the range of 0-30, i.e. $0 \leq a \leq 30$, even more especially $0 \leq a \leq 12$, such as $8 \leq a \leq 12$.

Especially, the luminescent lanthanide is selected from the group consisting of Eu (II), Sm, Yb, Ce, Pr, Nd, Sm, Eu (III), Gd, Tb, Dy, Ho, Er, and Tm. The elements Eu (II), Sm, Yb may be incorporated in the alkaline earth aluminum nitride based material as divalent cations. Ce, Pr, Nd, Sm, Eu (III), Gd, Tb, Dy, Ho, Er, and Tm may be incorporated in the alkaline earth aluminum nitride based material as trivalent cations. Especially these elements are known to provide luminescence in the visible, under excitation with UV and/or blue light, when such elements are available in the indicated valence state. Note that also a combination of two or more of such luminescent lanthanides may be applied. Especially, divalent Europium or trivalent cerium, or a combination of these is (at least) applied. Specific examples thereof are $Ca_{(20-x)}Li_{(8+2x)}Al_{39}N_{55}:Eu_x$, such as $Ca_{18.75}Li_{10.5}Al_{39}N_{55}:EU$ or $Ca_{17.75}Li_{10.5}Si_{18}\ Al_{21}C_{18}N_{37}:EU_{1.0}$, $Ca_{20-x}Mg_6[Al_{35}Mg_4N_{55}]:Eu_x$, $Ca_{14}Sr_{6-x}Li_8[Al_{39}N_{55}]:Eu_x$, $Ca_{18.5}Li_{9.5}Al_{39}N_{55}:Ce_{0.5}$, $Ca_{13.75}Na_2Li_{10.5}Si_2Al_{37}N_{55}:EU_{3.0}$, etc. In a specific embodiment, the alkaline earth aluminum nitride based material comprises $M_{(20-\delta)}A_{(8+2\delta)}Al_{39}N_{55}:Eu$ (i.e. divalent Eu), with $\delta$ in the range of 0-2, with especially M at least comprising Ca and A at least comprising Li. Here, equivalent molar amounts of M and Eu may be exchanged, i.e. $M_{(20-\delta-x)}A_{(8+2\delta)}Al_{39}N_{55}:Eu_x$. Instead of (divalent) Eu, this material may also be doped with (trivalent) cerium, or alternatively a combination of trivalent cerium and divalent europium. Hence, in a specific embodiment, the alkaline earth aluminum nitride based material comprises $M_{(20-\delta-y)}A_{(8+2\delta-y)}Al_{39}N_{55}:Ce_y$, with especially M at least comprising Ca and A at least comprising Li.

Codoping of alkaline metal containing phosphors as claimed in this invention with both Ce(III) and Eu(II) may lead to phosphors with efficient red emission and reduced self-absorption of the Eu(II) emission due to low Eu concentrations. An example for such a material is e.g. $Ca_{18.4}Li_{9.5}Al_{39}N_{55}:Ce_{0.5}EU_{0.1}$. While a Ce(III) only doped phosphor, like e.g. $Ca_{18.5}Li_{9.5}Al_{39}N_{55}:Ce_{0.5}$, may show Ce(III) 5d→4f luminescence in the yellow spectral range, a codoped material, like $Ca_{18.4}Li_{9.5}Al_{39}N_{55}:Ce_{0.5}Eu_{0.1}$, may show efficient energy transfer from excited Ce(III) atoms to Eu(II) atoms (and subsequent Eu emission in the red).

The (luminescent) lanthanide element may be incorporated on lattice position of the crystalline lattice of the alkaline earth aluminum nitride based material. However, the lanthanide element may also be incorporated on an interstitial position of the crystalline lattice of the alkaline earth aluminum nitride based material. This may depend upon the type of lanthanide and/or its valence. This is known to the person skilled in the art.

The species ES and RE are herein also indicated as dopants. In a specific embodiment, the phosphor may in addition or alternative to the luminescent rare earth ions (RE) (also) include non-luminescent rare earth ions.

Assuming ES to be samarium and europium (and optionally also (divalent) ytterbium), the value for x is still as herein indicated, but is the summation of the individual species. Likewise, this applies to all other elementary species indicated in the formula.

Divalent and trivalent samarium and/or divalent and trivalent europium may be present depending upon e.g. the (reducing) conditions during synthesis. As luminescent ions preferably RE and ES consist of (a) $Eu^{2+}$ (i.e. no RE, and no Sm) or (b) $Ce^{3+}$ (i.e. no ES, and no other RE) or (c) $Eu^{2+}$ and $Ce^{3+}$ (i.e. no Sm and no other RE). Hence, in embodiment (a), the molar ratio between the sum of the other all optional ES and RE on the one hand, and Eu on the other hand $((Sm(II)+RE)/Eu)<0.1$, especially $<0.01$, even more $<0.0001$; in embodiment (b), the molar ratio between the sum of the other all optional ES and RE on the one hand, and Ce on the other hand $((ES+RE)/Ce)<0.1$, especially $<0.01$, even more $<0.0001$; and in embodiment (b), the molar ratio between the sum of the other all optional ES and RE on the one hand, and Eu(II) and Ce on the other hand $((ES+RE)/(Ce+Eu(II)))<0.1$, especially $<0.01$, even more $<0.0001$. Would also Yb(II) be available, $((Sm(II)+RE)/Eu)$ may be redefined as $((Sm(II)+Yb(II)+RE)/Eu)$, with $((Sm(II)+Yb(II)+RE)/Eu))<0.1$, especially $<0.01$, even more $<0.0001$. Especially, as divalent luminescent species only one or more of Sm and Eu are chosen, especially substantially only Eu.

In yet a further embodiment, RE comprises Ce, and $x/y<0.1$, especially $<0.01$, even more especially $<0.001$, and $n \leq 0.1$. Hence, in this embodiment, RE comprises, or especially consists of cerium. This implies that when trivalent Ce is applied (as RE), optional divalent lanthanides SE are present in a molar amount that is less than 10% of the molar amount of Ce, respectively. For instance, when Ce is present, with $y=0.05$, for instance x1 for (divalent) Sm may be 0.001, and x2 for (divalent) Eu may be 0.001, leading to an $x=x1+x2=0.002$. In such instance, $x/y=0.04$. Even more especially, $x=0$. In another embodiment, as RE Ce and Pr are applied (especially in the absence of Sm and Eu); Pr may provide a(n additional) red luminescence. Trivalent cerium may be used to provide a yellow and/or green emitter, and/or to sensitize divalent europium (in the case both Ce and Eu are present).

When ES is available and RE is available, in an embodiment y/x is preferably $<0.1$, especially $<0.01$, in case RE≠Ce. This implies that when divalent Eu and/or Sm are applied, optional trivalent lanthanides RE are present in a molar amount that is less than 10% of the molar amount of Eu and/or Sm, respectively, in case where the optional trivalent lanthanide is not cerium. In a specific embodiment, $x>0$, and $y=0$; e.g. ES is substantially exclusively europium, like as dopant divalent europium is present, and all other potentially luminescent dopants are not available, or available in molar amounts less than 0.01% of the molar amount of divalent europium.

The conditions wherein $x/y<0.1$ or wherein $y/x<0.1$ indicate that either RE=Ce is predominantly present as luminescent species or ES=Eu is predominantly present as luminescent species. Note that these embodiments may also include the variants wherein $x=0$ (only Ce) or $y=0$ (only Eu), respectively.

Especially, when europium is applied as divalent luminescent species or dopant, the molar ratio between samarium and europium (Sm/Eu) is <0.1, especially <0.01, especially <0.001.

The same applies when europium in combination with ytterbium would be applied. When europium is applied as divalent luminescent species or dopant, the molar ratio between ytterbium and europium (Yb/Eu) is <0.1, especially <0.01, especially <0.001. Would all three together be applied, then the same molar ratios might apply, i.e. ((Sm+Yb)/Eu) is <0.1, especially <0.01, especially <0.001.

Especially, x is in the range of 0.001-0.2 (i.e. $0.001 \leq x \leq 0.2$), like 0.002-0.2, such as 0.005-0.1, especially 0.005-0.08. Especially in the case of divalent Europium in the herein described systems, the molar percentage may be in the range of 0.1-5% ($0.001 \leq x \leq 0.05$), such as 0.2-5%, like 0.5-2%. For other luminescent ions, x may (but is not necessarily) in embodiments be equal to or larger than 1% (x equal to or larger than 0.01).

In a specific embodiment, providing relative efficient phosphors, M comprises one or more of Ca, Sr, and Mg, A (if available) comprises Li, G at least comprises Al, Q (if available) comprises Mg, D (if available) comprises Si, R (if available) comprises 0, ES (if available) comprises Eu, and (if available) RE comprises Ce, wherein further x/y<0.1 or y/x<0.1, and wherein especially d=n=c=0. Especially, one or more of d=0, n=n, and c=0 may apply. In yet a further specific embodiment, which may be combined with the former embodiments, M is Ca and/or Sr, especially M comprises Ca.

The invention also relates to a luminescent material at least comprising this phosphor and optionally one or more other materials, like one or more other phosphors and/or one or more other phases like (remaining) flux material. The phosphor may also include impurities, like one or more of halogen impurities and metal impurities. The luminescent material, may next to the one or more phosphors as defined herein, also include other phases, like one or more of the—already indicated (remaining)—flux material, remaining starting material(s) and one or more phases that are also formed during synthesis of the one or more (respective) phosphors. Likewise, the phosphor may also include other phases, like one or more of the—already indicated (remaining)—flux material, remaining starting material(s) and one or more phases that are also formed during synthesis of the one or more (respective) phosphors. In general, the weight percentage of such other phase(s) will be below about 10 wt. % (relative to the total weight of the phosphor).

As indicated above, the phosphor may also include impurities. This is known in the art. Hence, in embodiments chemical formulas like, such as defined below, etc., do not exclude the presence of impurities, for instance up to a total of about 500 ppm, especially up to about 200 ppm, even more especially up to about 100 ppm. Hence, even though the chemical formula does not indicate the presence of impurities, impurities that may (nevertheless) be present can for instance be selected from the group consisting of Li, Na, K, Sc, Y, Ti, Zr, V, Nb, Cr, Mo, Mn, Fe, Ru, Co, Rh, Ni, Pd, Cu, Zn, V, C, N, O, F, Al, Si, P, S, Cl, Ga, Ge, Se, Br, Lu, La, Ce, Pr, Nd, Sm, Eu, Gd, Tb, Dy, Ho, Er, Tm, Yb, Hf, Ta, W, Re, Os, Ir, Pt, Tl, Pb, I, and Bi. Here, impurities are listed. When for instance the chemical formula indicates the availability of Li or Eu, these are—even when available in small amounts—not considered as impurities.

Further, the luminescent material may include one or more of scattering particles and a halide salt, especially at least scattering particles.

The present invention advantageously provides alternative phosphors, which amongst others may advantageously have one or more of the following properties: (1) emitting in one or more parts of the visible spectrum, at least in one or more of the orange-red, especially the red, (2) having a good efficiency, (3) having a narrow band width (in the orange-red), and (4) having other advantageous (optical) properties (such as a long life time/high stability).

The term "phosphor" is herein used for any material that upon excitation emits radiation in the visible part of the spectrum. Another term for "phosphor" may be luminescent material, but this term "luminescent material" is herein especially reserved for a material or material mixture comprising at least the phosphor (having the chemical formula as defined herein and optionally also one or more other phosphors (see also below).

The term phosphor may in an embodiment relate to a particulate phosphor and in another embodiment relate to a (mono crystalline) phosphor layer. In a specific embodiment, the term phosphor may include a self-supporting layer, such as a ceramic polycrystalline material. Likewise, the term "luminescent material" may in an embodiment relate to a particulate "luminescent material" and in another embodiment relate to a (mono crystalline) "luminescent material" layer. In a specific embodiment, the term "luminescent material" may include a self-supporting layer, such as a ceramic material. Hence, the term "luminescent material" may in embodiments also refer to a luminescent body. The term "ceramic" especially relates to an inorganic material that is obtainable by heating a (poly crystalline) powder, like at least 500° C., especially at least 800° C., such as at least 1000° C., under high pressure, such as at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing, or even processing into particles again). A ceramic especially has density that is at least 90%, such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles).

However, also in general, uniaxial or isostatic pressure may be applied to obtain the phosphor. Hence, in an embodiment, the invention also provides a method for producing the herein described phosphor by selecting starting materials in ratios that can lead to at least the desired phosphor and heating under pressure, especially uniaxial or isostatic pressure, even more especially isostatic pressure, the starting materials to produce at least the desired phosphor. Temperatures of especially at least 800° C. may be applied, up to about 1500° C., and pressures from atmospheric pressure up to the above indicated pressures or even above. Hence, in an embodiment the luminescent material is a ceramic (luminescent) material. As indicated above and/or as can be derived from the above, the luminescent material, and thus also the ceramic material in case a ceramic luminescent material is applied, may include one or more of the herein described phosphors and optionally one or more of (a) one or more other type of phosphors, (b) one or more other phases formed during synthesis of the one or more of the herein described phosphors (respectively), (c) one or more starting materials used during synthesis of the one or more of the herein described phosphors (respectively), (d) one or more fluxes used during synthesis of the one or more of the herein described phosphors (respectively), (e) one or more scattering materials, and (f) one or more other materials (such as a halide salt).

In an embodiment, the term "phosphor" may relate to a combination of different phosphors all complying with formula (I). The term "formula (I)" may also be indicated as "chemical formula (I)". Hence, the luminescent material at least comprises one or more phosphors having the chemical formula (I) and optionally one or more other phosphors not having this chemical formula (I) (such as e.g. $Y_3Al_5O_{12}$:$Ce^{3+}$ and/or $Sr_2Si_5N_8$:$Eu^{2+}$).

The novel phosphors can be made with solid state synthesis methods. Synthesis of the claimed materials can e.g. be carried out by a variety of processing methods. It has been found that keeping firing temperatures low (below ~1500° C., such as below 1400° C.) may improve phase purity and luminescence properties of the claimed phases. Hence, the invention also relates to a solid state nitride synthesis method performed at a temperature below 1400° C., and the phosphors of formula (I) obtainable by such synthesis method. It turned out that reactive precursors like intermetallic phases obtained by melting of the constituent(s) M, A, G, Q, D and ES and/or RE metals, alkaline earth amides, or silicon diimide are especially suitable. The addition of flux materials like fluorides or chlorides, especially at least fluorides, may also improve phase formation. Although not explicitly accounted for in the given formulas part of the added halide flux may remain within the phosphor after firing without deteriorating its luminescence properties. The same holds for other impurities like carbon that may to some extend be incorporated into the supertetrahedron lattice structure on nitrogen lattice sites during reactions in e.g. a graphite furnace or by application of a carbon reduction and nitridation (CRN) reaction method. Optionally, carbon (C) may intentionally be incorporated in the tetrahedral. Suitable synthesis methods comprise (a) high pressure nitridation, (b) processing in alkaline metal melts, (c) ammonothermal synthesis and (d) standard mix and fire approaches. In a specific embodiment, one or more of the starting materials comprise hydrides (such as $SrH_2$), and optionally as synthesis method hot isostatic pressing (HIP) is applied. In yet a specific embodiment, one or more of the starting materials comprise hydrides (such as $SrH_2$), and a surplus of earth alkali metal is applied in the form of alkali metal fluoride (such as $SrF_2$), and optionally as synthesis method hot isostatic pressing (HIP) is applied.

Such synthesis methods are known in the art, and are for instance described in Watanabe, et al, Synthesis of $Sr_{0.99}Eu_{0.01}AlSiN_3$ from intermetallic precursor, Journal of the Ceramic Society of Japan 117 (2009) 115-119; Zeuner et al, $Li_2CaSi_2N_4$ and $Li_2SrSi_2N_4$— a Synthetic Approach to Three-Dimensional Lithium Nitridosilicates European Journal of Inorganic Chemistry (2010) 4945-495; and Li et al, Low-Temperature Crystallization of Eu-Doped Red-Emitting $CaAlSiN_3$ from Alloy-Derived Ammonometallates, Chemistry of Materials 19 (2007) 3592-3594.

In yet a further specific embodiment, the invention provides a coated phosphor. In yet another specific embodiment, the invention provides an embedded phosphor. In the former embodiment, the coated embodiment, especially the phosphor is a particulate phosphor, with phosphor particles comprising a coating. However, the phosphor may also comprise a layer that is coated on one or both sided with a coating. In the latter embodiment, the phosphor may be embedded in an organic or inorganic host material. For instance, the phosphor may comprise a particulate phosphor, wherein the particles of the particulate phosphor are embedded in an organic or inorganic host, like e.g. PMMA, PET, PC, silsesquioxane, glass, etc.

In a specific embodiment, the phosphor comprises an $AlPO_4$ coating. Such coating may e.g. be provided by a method described by Cho et al. (2005) in "Control of $AlPO_4$-nanoparticle coating on $LiCoO_2$ by using water or ethanol", Electrochimica Acta 50, 4182-4187. One or more alternative or additional coatings may include one or more of an $Al_2O_3$ coating and a $SiO_2$ coating. The coating may also be a composite coating consisting of more than one coating layer with each coating layer having a specific composition. Such a composite coating may comprise e.g. a first silica coating layer and a second alumina coating layer.

An $Al_2O_3$ coating may be prepared by e.g. atomic layer deposition (such as e.g. described in Avci, N.; Musschoot, J.; Smet, P. F.; Korthout, K.; Avci, A.; Detavernier, C.; Poelman, D. Microencapsulation of Moisture-Sensitive $CaS$:$Eu^{2+}$ Particles with Aluminum Oxide. J. Electrochem. Soc. 2009, 156, J333-J337).

A silica coating may for e.g. be prepared via sol-gel. Such method may include stirring phosphor powder in ethanol with some tetramethoxysilane. Then, concentrated $NH_3$ solution is added. After ammonia addition, tetraethoxysilane in ethanol can be added in a closed system while stirring; optionally sonication may be applied. The suspension thus obtained can be filtered, washed, and dried.

The term "comprising" may in an embodiment refer to "consisting of" but may in another embodiment also refer to "containing at least the defined species and optionally one or more other species". The phrase "selected from the group consisting of trivalent" may refer in an embodiment to a single species selected from the group, but may in another embodiment also refer to one or more species selected from that group. Hence, sometimes the phrase "one or more selected from the group consisting of" is also applied. Therefore, phrases like "M selected from the group consisting of Ca, Sr, and Mg" may indicate one or more M (species) selected from the group consisting of Ca, Sr, and Mg. Therefore, such phrase also relate to combinations of two or more (where applicable).

The incorporation of oxygen via starting materials or during processing of the claimed composition can be compensated by adjustment of the host lattice cation composition as defined in above formula(s). Preferably, n is small, n<0.1, since it was found that higher O concentrations may lead to samples with reduced stability. Even more especially, n=0.

As indicated above, RE elements may be incorporated in the lattices to increase stability or to modify the emission characteristics. Incorporation of RE typically lead to a blue shift of the Eu(II) emission bands. Ce(III) incorporation may lead to emission in the green to yellow spectral range. Codoping of the Eu(II) doped compounds with Ce(III) may be used to increase the absorption in the near-UV to green spectral range with Ce(III) acting as a sensitizer for the Eu(II) emission (see also above).

The term light source may in principle relate to any light source known in the art, but may especially refer to a LED-based light source, herein further indicated as LED. The description below will—for the sake of understanding—only address LED-based light sources. The light source is configured to provide UV and/or blue light. In a preferred embodiment, the light emitting diode is configured to generate LED light with a blue component. In other words, the light source comprises a blue LED. Hence, in an embodiment, the light source is configured to generate blue light. Especially, the LED is a solid state LED. Hence, especially the light source comprises a light emitting diode.

In yet another embodiment, the light emitting diode is configured to generate LED light with a UV component. In other words, the light source comprises a UV LED. When a UV light source is applied and blue or white light is desired, as blue component, for instance the well-known materials $BaMgAl_{10}O_{17}:Eu^{2+}$, $(Sr,Ba,Ca)_5(PO_4)_3Cl:Eu^{2+}$ or $(Sr,Ba,Ca)_3MgSi_2O_8:Eu^{2+}$ may be applied. However, also other luminescent materials that are able to convert UV light into blue light may alternatively or additionally be applied.

Preferably, the light source is a light source that during operation emits at least light at a wavelength selected from the range of 200-490 nm, especially a light source that during operation emits at least light at wavelength selected from the range of 400-490 nm, even more especially in the range of 360-460 nm. This light may partially be used by the luminescent material(s) (see below). In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs. Hence, in a specific embodiment, the light source is configured to generate blue light.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600 nm. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The luminescent material comprises one or more phosphors as described herein, and optionally one or more further phosphors selected from the group consisting of divalent europium containing nitride luminescent material or a divalent europium containing oxonitride luminescent material. The luminescent material may in an embodiment further comprise one or more materials selected from the group consisting of $(Ba,Sr,Ca)(S,Se):Eu$, $(Mg,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba. The material $(Ba,Sr,Ca)(S,Se):Eu$ can also be indicated as $M(S,Se):Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8:Eu$, (i.e. 75% Ba; 25% Sr). Here, Eu is introduced and replaces at least part of M i.e. one or more of Ba, Sr, and Ca). Likewise, the material $(Ba,Sr,Ca)AlSiN_3:Eu$ can also be indicated as $MAlSiN_3:Eu$ wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the first luminescent material comprises $(Ca,Sr,Mg)AlSiN_3:Eu$, preferably $CaAlSiN_3:Eu$. Further, in another embodiment, which may be combined with the former, the first luminescent material comprises $(Ca,Sr,Ba)_2Si_5N_8:Eu$, preferably $(Sr,Ba)_2Si_5N_8:Eu$. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc. The term "(S,Se)" may indicate that as anions one or more of S and Se may be available, especially at least S optionally in combination with Se.

Hence, in an embodiment the luminescent material may further comprise $M_2Si_5N_8:Eu^{2+}$, wherein M is selected from the group consisting of Ca, Sr and Ba, even more especially wherein M is selected from the group consisting of Sr and Ba. In yet another embodiment, which may be combined with the former, the luminescent material may further comprise $MSiAlN_3:Eu^{2+}$, wherein M is selected from the group consisting of Ca, Sr and Ba, even more especially wherein M is selected from the group consisting of Sr and Ba.

The luminescent material may also comprise one or more phosphors selected from the group consisting of a trivalent cerium containing garnet and a trivalent cerium containing oxonitride. The oxonitride materials are in the art often also indicated as oxonitride materials.

Especially, the luminescent material may further comprise a $M_3A_5O_{12}:Ce^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the second luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Embodiments of garnets especially include $M_3A_5O_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}:Ce$, wherein x is equal to or larger than 0 and equal to or smaller than 1. The terms ":Ce" or ":Ce$^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Therefore, the luminescent material may in an embodiment further comprise one or more other phosphors selected from the group consisting of a divalent europium containing nitride luminescent material, a divalent europium containing oxonitride luminescent material, a trivalent cerium containing garnet and a trivalent cerium containing oxonitride.

As will be clear to the person skilled in the art, also combinations of phosphors may be applied. Further, as will be clear to the person skilled in the art, optimization of the luminescent material(s) (or phosphors) with respect to one or more of constituting elements, activator concentration, particle size, etc. or optimization with respect to luminescent material combination(s), may be applied to optimize the illumination device.

The light source may be configured in a chamber, with reflective wall(s) (such as coated with a reflective material like $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

The luminescent material is configured to convert at least part of the light source light. In other words, one may say that the light source is radiationally coupled to the luminescent material. When the light source comprises a substantially UV light emitting light source, the luminescent material may be configured to convert substantially all light source light that impinges on the luminescent material. In case the light source is configure to generate blue light, the luminescent material may partly convert the light source light. Dependent upon the configuration, a part of the remaining light source light may be transmitted through a layer comprising the luminescent material.

Here, a number of applications of the invention are indicated: office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, and green house lighting systems.

As indicated above, the lighting unit may be used as backlighting unit in an LCD display device. Hence, in a further aspect, the invention provides also a LCD display device comprising the lighting unit as defined herein, configured as backlighting unit.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "comprising" may in an embodiment refer to "consisting of" but may in another embodiment also refer to "containing at least the defined species and optionally one or more other species". The term "and/or" especially relates to one or more of the items mentioned before and after "and/or". For instance, a phrase "item 1 and/or item 2" and similar phrases may relate to one or more of item 1 and item 2.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 shows an EELS spectrum of the invented phosphor material. The energy loss region of Li—K edge, Al-$L_{2,3}$ and Al-$L_1$ is shown. The background left to the Li—K edge has been subtracted. EL indicates energy loss (in eV); I indicates the intensity (in arbitrary units).

DETAILED DESCRIPTION OF THE EMBODIMENTS

Figure 1A:
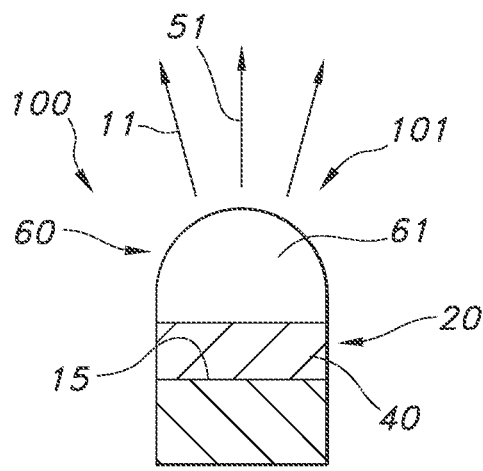
FIGS. 1a-1d schematically depict some embodiments of the lighting unit; the drawings are not necessarily on scale.
Figure 1B:
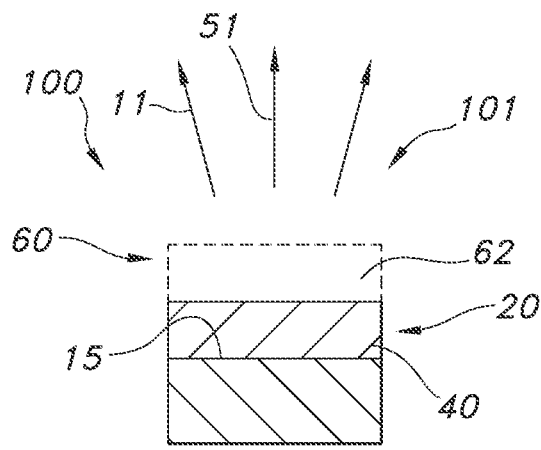
Figure 1C:
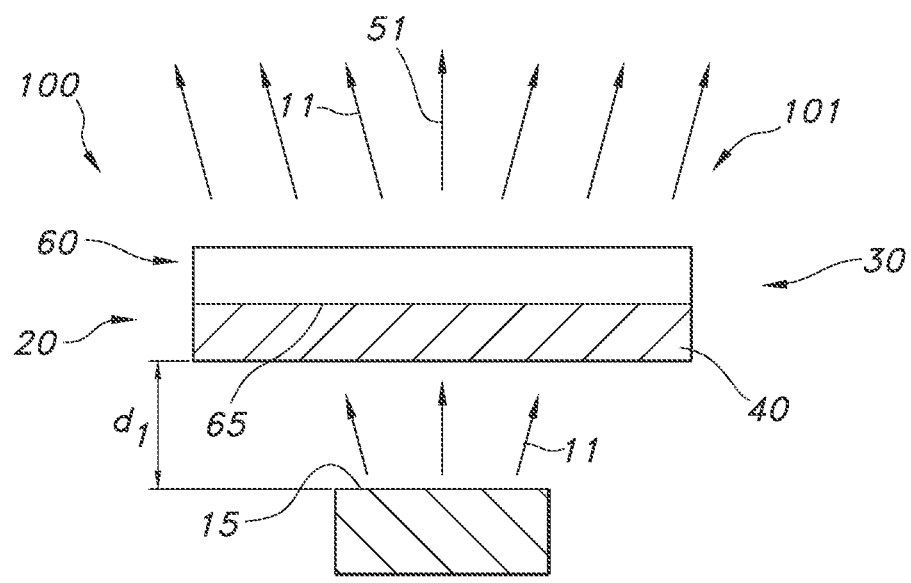
Figure 1D:
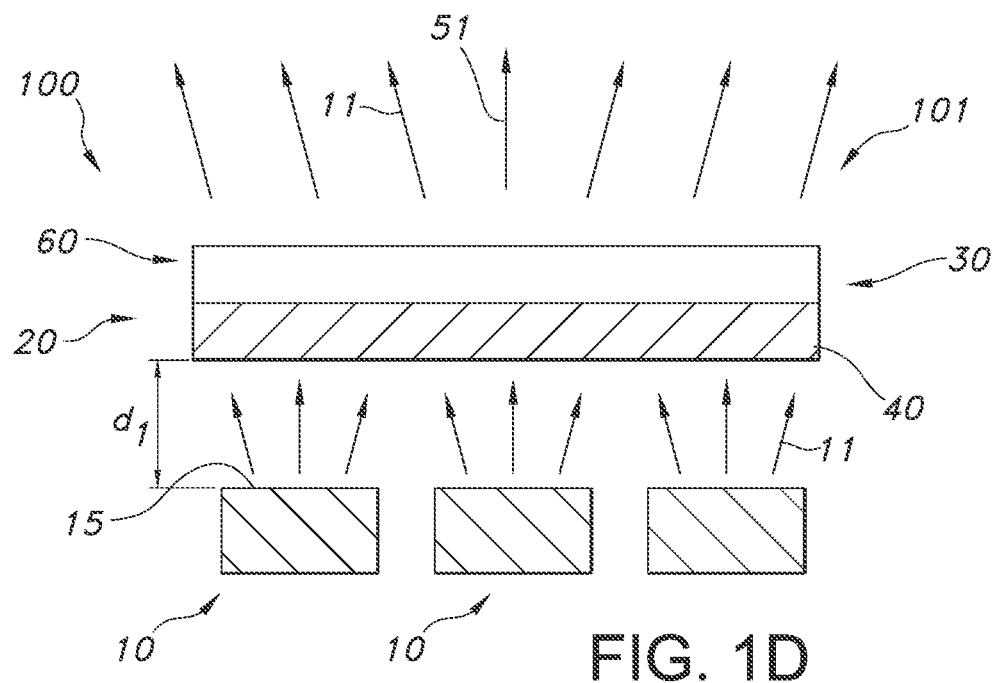

FIG. 1a schematically depicts an embodiment of the lighting unit, indicated with reference 100, of the invention. The lighting unit comprises a light source 10, which is in this schematic drawing a LED (light emitting diode). In this embodiment, on top of the light source 10, here on the (light exit) surface 15, thus downstream of the light source 10, a luminescent material 20 is provided. This luminescent material 20 comprises phosphor as described herein, indicated with reference 40. By way of example, the lighting unit 100 further comprises, for instance for light extraction properties, a (transmissive) dome 61. This is an embodiment of a transmissive optical element 60, which is in this embodiment arranged downstream of the light source 10 and also downstream of the light conversion layer 20. The light source 10 provides light source light 11 (not indicated in the drawing), which is at least partly converted by the light conversion layer 20, at least by phosphor 40, into luminescent material light 51. The light emanating from the lighting unit is indicated with reference 101, and contains at least this luminescent material light 51, but optionally, dependent upon the absorption of luminescent material 50 also light source light 11. FIG. 1b schematically depicts another embodiment, without dome, but with an optional coating 62. This coating 62 is a further example of a transmissive optical element 60. Note that the coating 62 may in an embodiment be one or more of a polymeric layer, a silicone layer, or an epoxy layer. Alternatively or additionally a coating of silicon dioxide and/or silicon nitride may be applied. In both schematically depicted embodiment of FIGS. 1a-1b, the luminescent material 20 is in physical contact with the light source 10, or at least its light exit surface (i.e. surface 15), such as the die of a LED. In FIG. 1c, however, the luminescent material 20 is arranged remote from the light source 10. In this embodiment, the luminescent material 20 is configured upstream of a transmissive (i.e. light transmissive) support 30, such as an exit window. The surface of the support 30, to which the light conversion layer 20 is applied, is indicated with reference 65. Note that the luminescent material 20 may also be arranged downstream of the support 30, or at both sides of the support luminescent material 20 may be applied. The distance between the luminescent material 20 and the light source (especially its light exit surface 15) is indicated with reference d1, and may be in the range of 0.1 mm-10 cm. Note that in the configuration of FIG. 1c, in principle also more than one light source 10 may be applied. FIG. 1d is schematically the same as FIG. 1c, but now with a plurality of light sources 10. Optionally, the luminescent material is shaped into a self-supporting layer, such as a ceramic material. In such instance, the transmissive optical element 60 may not be necessary, but may nevertheless be present.

The novel phosphor disclosed herein is obtained by a solid-state reaction. For the preparation of $Eu^{2+}$-doped $Ca_{18.75}Li_{10.5}Al_{39}N_{55}$ stoichiometric amounts of the starting materials Calcium hydride, Lithium nitride, Aluminum and Europium fluoride are mixed. The concentration of $Eu^{2+}$ in the mixture is 0.5 mole % based on the Calcium amount. Subsequently, the mixture is heated in nitrogen for 5 hours at 1250° C.

The novel phosphor was indexed as cubic lattice from single crystal X-ray pattern (using Mo-Kα radiation) with the resulting formula $Ca_{18.75}Li_{10.5}Al_{39}N_{55}$. The crystallographic data of $Ca_{18.75}Li_{10.5}Al_{39}N_{55}$ are visible in table 1, the atomic coordinates, isotropic displacement parameters and Wyckoff positions in table 2 (both obtained from single-crystals).

TABLE 1

Crystallographic data of the invented phosphor $Ca_{18.75}Li_{10.5}Al_{39}N_{55}$ obtained from a single-crystal:

| | |
|---|---|
| Formula | $Ca_{18.75}Li_{10.5}Al_{39}N_{55}$ |
| Crystal system | cubic |
| Space group | Fd-3m (no. 227) |
| Lattice parameters/Å | a = b = c = 22.415(3) |
| Cell volume/Å$^3$ | 11263(2) |
| Formula units/cell | 8 |

TABLE 2

Atomic coordinates, isotropic displacement parameters (in Å$^2$) and Wyckoff positions of $Ca_{18.75}Li_{10.5}Al_{39}N_{55}$:$Eu^{2+}$, standard deviations in parentheses (obtained from a single-crystal):

| Atom | Wyckoff | Site | SOF | x | y | z | $U_{eq}$ |
|---|---|---|---|---|---|---|---|
| Ca1 | 96h | ..2 | | 0 | 0.35133 | 0.64867 | 0.01111(14) |
| Ca2 | 48f | 2.mm | | 0.2948 | 1/8 | 1/8 | 0.01019(16) |
| Ca3 | 16d | .-3m | 0.375 | 1/2 | 1/2 | 1/2 | 0.0139(8) |
| Al1 | 96g | ..m | | 0.27368 | 0.27368 | 0.17825 | 0.00701(17) |
| Al2 | 96g | ..m | | 0.27747 | 0.27747 | 0.37409 | 0.00713(18) |
| Al3 | 48f | 2.mm | | 0.43026 | 1/8 | 1/8 | 0.0075(2) |
| Al4 | 32e | .3m | | 0.04659 | 0.04659 | 0.04659 | 0.0071(3) |
| Al5 | 32e | .3m | | 0.17601 | 0.17601 | 0.17601 | 0.0071(3) |
| Al6 | 8b | -43m | | 3/8 | 3/8 | 3/8 | 0.0070(5) |
| N1 | 96g | ..m | | 0.02341 | 0.02341 | 0.32571 | 0.0082(4) |
| N2 | 96g | ..m | | 0.02561 | 0.02561 | 0.12678 | 0.0078(4) |
| N3 | 96g | ..m | | 0.07474 | 0.07474 | 0.47744 | 0.0084(4) |
| N4 | 96g | ..m | | 0.32478 | 0.32478 | 0.13032 | 0.0085(4) |
| N5 | 32e | .3m | | 0.32638 | 0.32638 | 0.32638 | 0.0068(7) |
| N6 | 16c | .-3m | | 0 | 0 | 0 | 0.0088(11) |
| N7 | 8a | -43m | | 1/8 | 1/8 | 1/8 | 0.0091(15) |
| Li1 | 192i | 1 | 0.219 | 0.01804 | 0.206 | 0.32236 | 0.027(6) |
| Li2 | 96h | ..2 | 0.438 | 0 | 0.43483 | 0.56517 | 0.027(6) |

Figure 2:
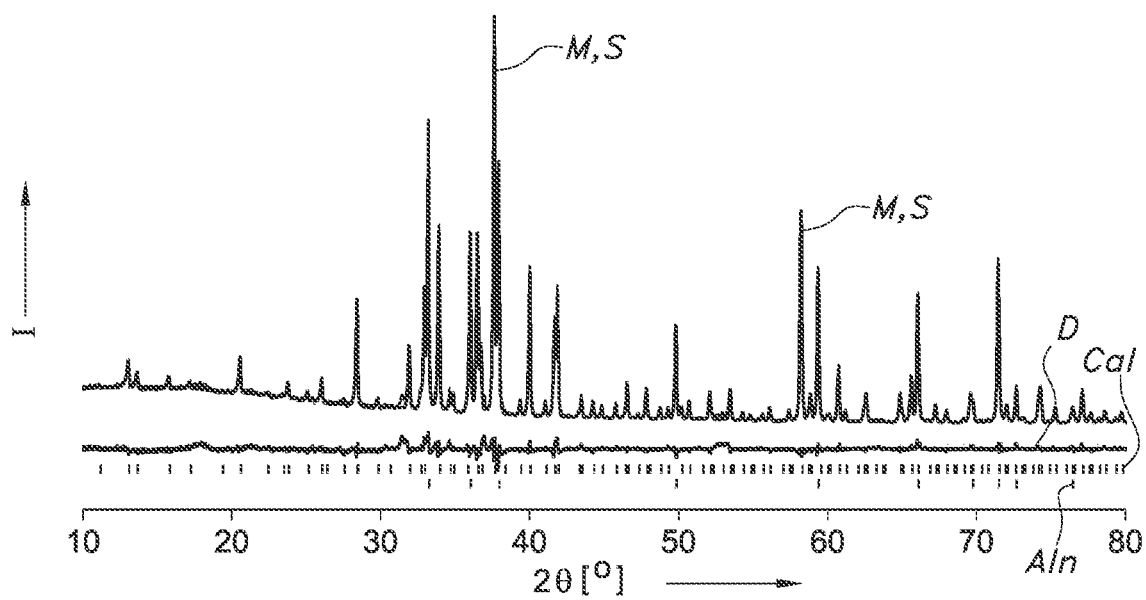
FIG. 2 shows the powder XRD pattern (M) and simulated (S) diagram. The minor phase AlN is tagged with asterisks. Note that the simulated (S) and measured (M) are nearly identical. Reference D indicates the difference between measured (M) and simulated (S). Reference Ca1 indicates the calculated XRD reflection positions.

The Rietveld refinement of the crystallographic data from powder XRD measurements (Fd-3m, Z=8, a=22.3609(3) Å) confirmed the data obtained from single crystals (Fd-3m, Z=8, a=22.415(3) Å). The powder XRD of the invented cubic phase is visible in FIG. 2. As minor phase, AlN is detected (marked with asterisks).

Figure 3:
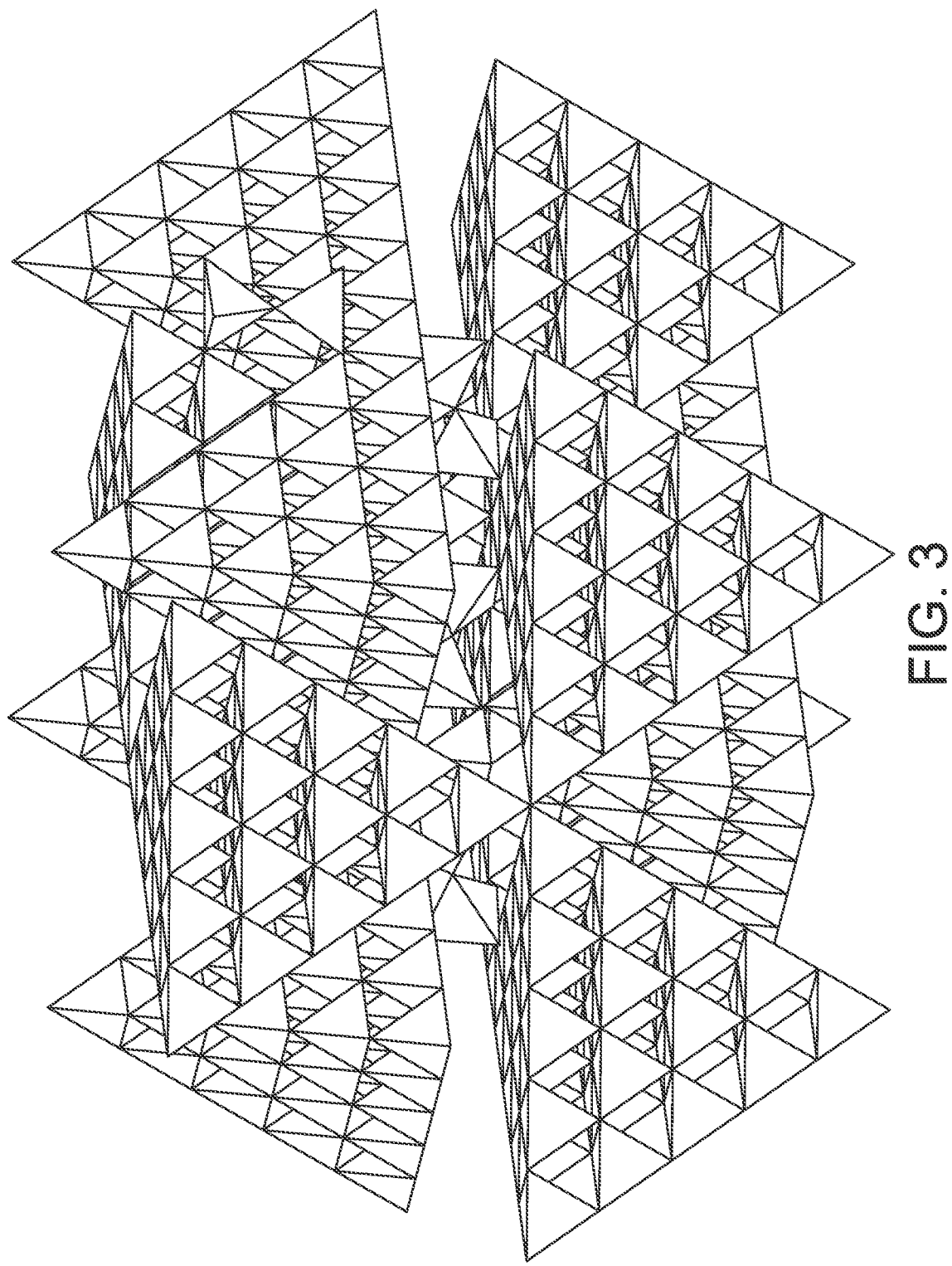
FIG. 3 shows a sketched structure of the invented phosphor showing the characteristic structural feature of connected T5 supertetrahedra with the general chemical sum $M_{35}X_{56}$ consisting of 35 regular AlN4-tetrahedra. The small AlN4-tetrahedra (single tetrahedron in a layer in the middle between the upper layer with four T5 supertetrahedra pointing up and the lower layer with four T5 supertetrahedra pointing down) acting as bridge between the T5-supertetrahedron structures. Each supertetrahedron is built up by corner-sharing AlN4 subunits.

In FIG. 3, the structure of the invented phosphor is sketched showing the characteristic structural feature of a T5 supertetrahedral cluster with the general chemical sum $M_{35}X_{56}$ consisting of 35 regular $AlN_4$-tetrahedra. The intermediate $AlN_4$-tetrahedra dimers acting as bridge between the T5-supertetrahedron structures. There may be three different Calcium coordination sites and two different Lithium sites. Both cations ($Ca^{2+}$ and $Li^+$) are filling the interstitial space between the T5 supertetrahedra lattice framework structure.

Figure 4A:
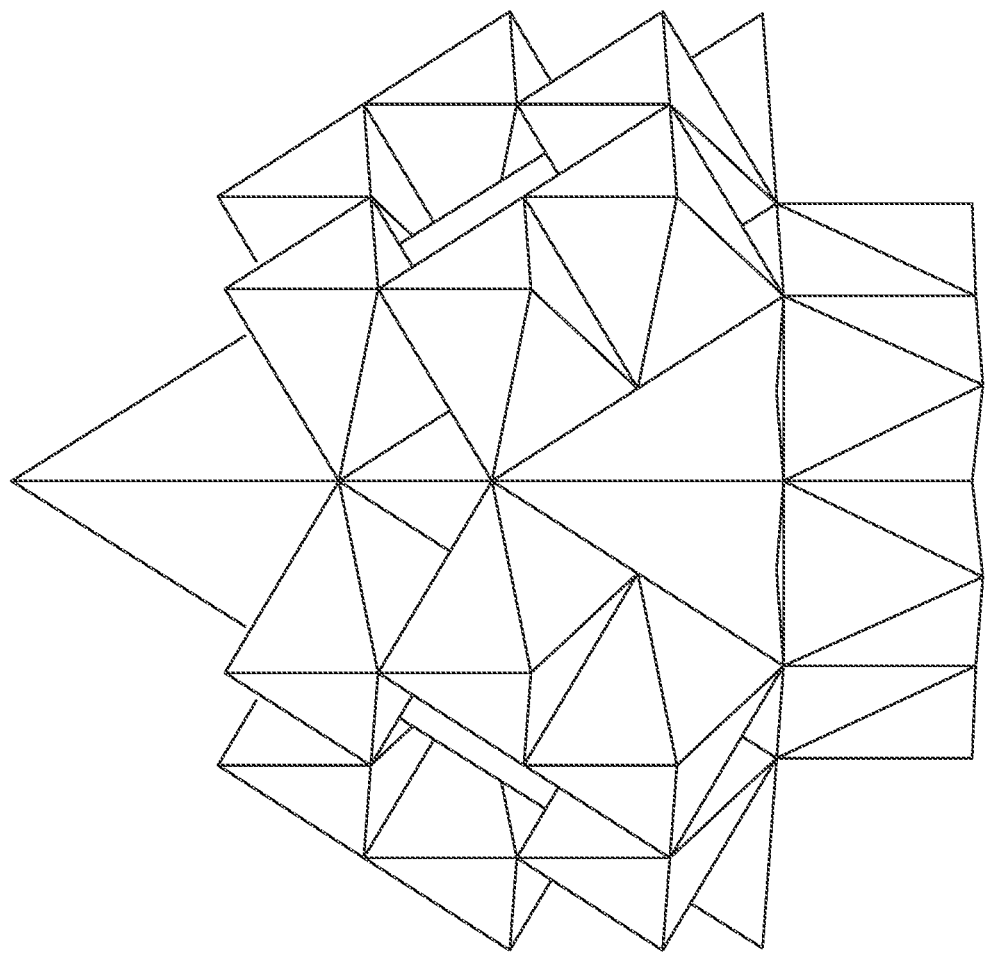
FIGS. 4a-4c show sketched structures of the invented phosphor showing the three different Calcium coordination sites Ca1 (Wyckoff position 96h), Ca2 (Wyckoff position 48f) and Ca3 (Wyckoff position 16d) filling interstitial space between the T5-supertetrahedra-lattice framework structure. Two of the three different Calcium sites Ca1 (Wyckoff position 96h) and Ca3 (Wyckoff position 16d) coordinate octahedrally (FIG. 4a,c), the third Calcium site Ca2 (Wyckoff position 48f) coordinates trigonal prismatically (FIG. 4b) The Ca3-site (Wyckoff position 16d) can be occupied partially.
Figure 4B:
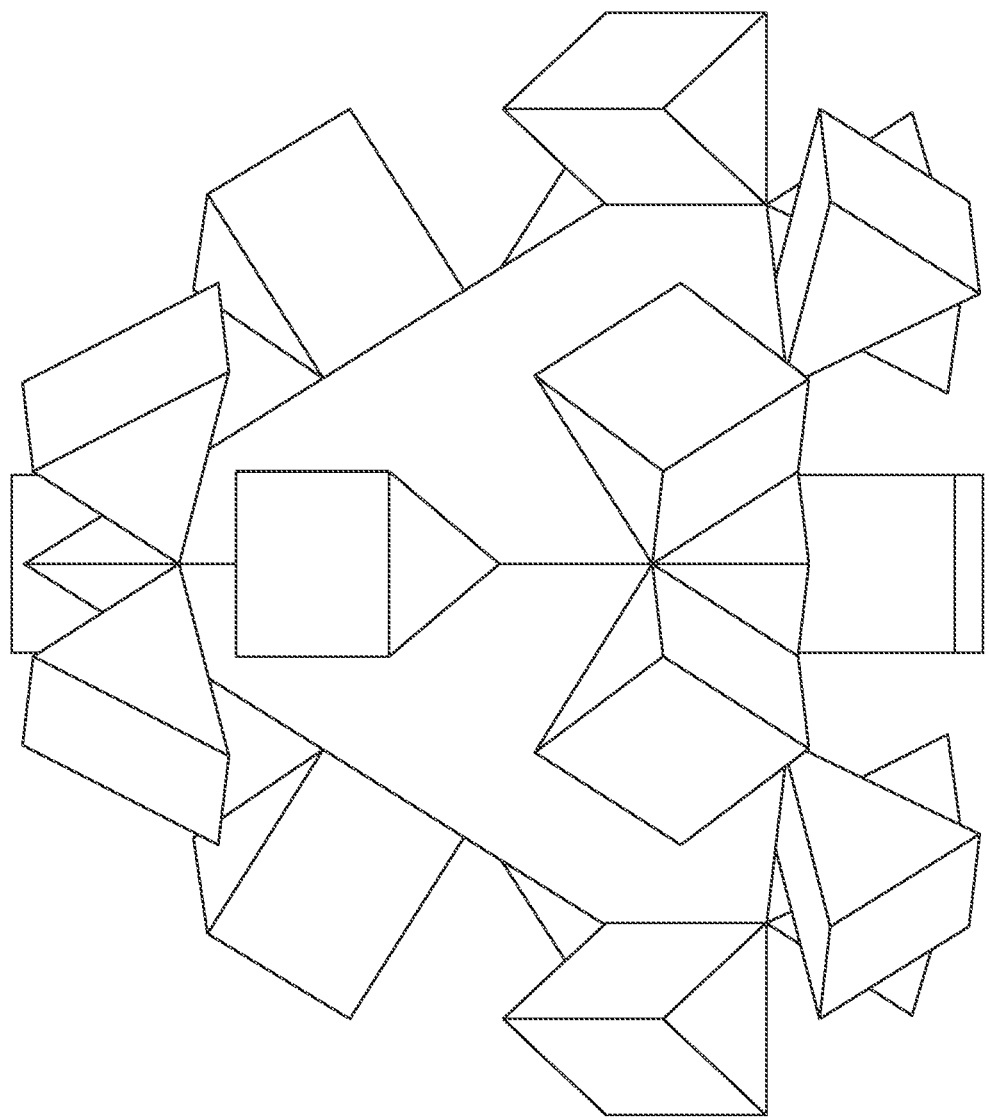
Figure 4C:
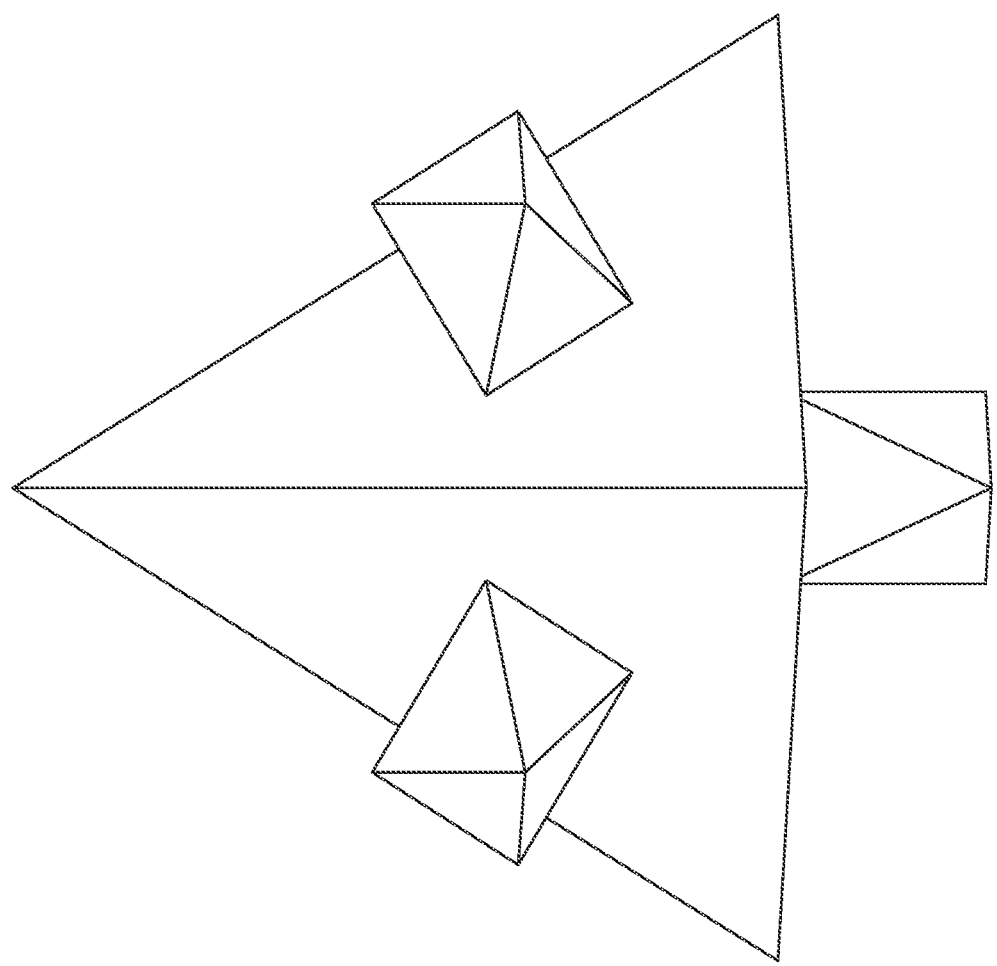

Two of the three different Calcium sites Ca1 (Wyckoff position 96h) and Ca3 (Wyckoff position 16d) coordinate octahedrally (FIG. 4a,4c), the third Calcium site Ca2 (Wyckoff position 48f) coordinates trigonal prismatically (FIG. 4b) The Ca3-site (Wyckoff position 16d) can be occupied partially. As a consequence, the Calcium and Lithium content can vary between two extremes as follows:

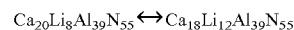

$Ca_{20}Li_8Al_{39}N_{55} \longleftrightarrow Ca_{18}Li_{12}Al_{39}N_{55}$

The general chemical formula is $Ca_{(20-\delta)}Li_{(8+2\delta)}Al_{30}N_{55}$ (with δ in the range of 0-2). Compared to the published $Na_{26}Mn_{39}O_{55}$ structure (published by Möller et al., see above), the quadratic pyramidal coordinating Na3-sites (Wyckoff position 96g) are not occupied by the adequate Calcium cations (Ca2-sites). However, these Calcium cations coordinate additionally in a trigonal prismatical position (Wyckoff position 48f) which is not found for the adequate Na-site in the oxide structure.

The photoluminescence spectra (FIG. 5b) of such a phosphor reveal a narrow red emission with a peak located at around 647 nm and a FWHM of about 1140 cm$^{-1}$. A broad absorption in the blue spectra region is visible in the reflection and photoluminescence excitation spectra (monitored at 650 nm).

It is believed that the larger Eu(II) ion preferably occupies the larger trigonal prismatically coordinated cation site (Ca2, Wyckoff position 48f). It is further believed that other larger alkaline earth cations like Sr(II) are incorporated preferably on this position.

Part or all of the Li(I) and Al(III) can e.g. be substituted by Mg(II) to form e.g. a material of composition $Ca_{20-x}Mg_6$ [$Al_{35}Mg_4N_{55}$]:$Eu_x$. Part of the Ca(II) can e.g. be substituted by Sr(II) to shift the absorption and emission band positions of Eu(II) towards higher energies. Examples are e.g. compositions of stoichiometry $Ca_{14}ST_{6-x}Li_8[Al_{30}N_{55}]$:$Eu_x$.

Part or all of the Eu(II) dopant can be replaced by Ce(III) which shows absorption centered in the 430-480 nm spectral range and emission in the 510-570 nm range. Increasing the Ce concentration shifts the emission towards longer wavelengths. If both activators, Eu(II) and Ce(III) are present in the structure, emission in the green to yellow and in the red spectral range is obtained. Charge compensation for Ce(III) replacing e.g. Ca(II) in the structure can be realized by e.g. adjusting the Ca/Li ratio in the structure. An example for such an embodiment is e.g. $Ca_{18.5}Li_{9.5}Al_{39}N_{55}:Ce_{0.5}$. Another example is e.g. $Ca_{18.4}Li_{0.5}Al_{39}N_{55}:Ce_{0.5}Eu_{0.1}$.

Low oxygen contents of the claimed phosphors are being preferred to maximize the desired emission properties, however, smaller amounts of oxygen incorporated e.g. via the starting materials can be tolerated in the structure by e.g. formal substitution of [AlN] pairs in the T5 supertetrahedra structure by [MgO] pairs. Accordingly, Mn(II) or Zn(II) can be incorporated in the tetrahedral network.

Incorporation of tetravalent ions like Si in the T5 supertetrahedra network to e.g. further increase the lattice stability at elevated temperatures or to modify the host lattice band gap structure can be realized by e.g. formal substitution of [AlN] pairs in the T5 supertetrahedra structure by [SiC] pairs or by e.g. replacing part of the Ca(II) by monovalent Na. Examples for such compositions are e.g. $Ca_{17.75}Li_{10.5}Si_{18}Al_{21}C_{18}N_{37}:Eu_{1.0}$ or $Ca_{13.75}Na_2Li_{10.5}Si_2Al_{37}N_{55}:Eu_{3.0}$.

Figure 5A:
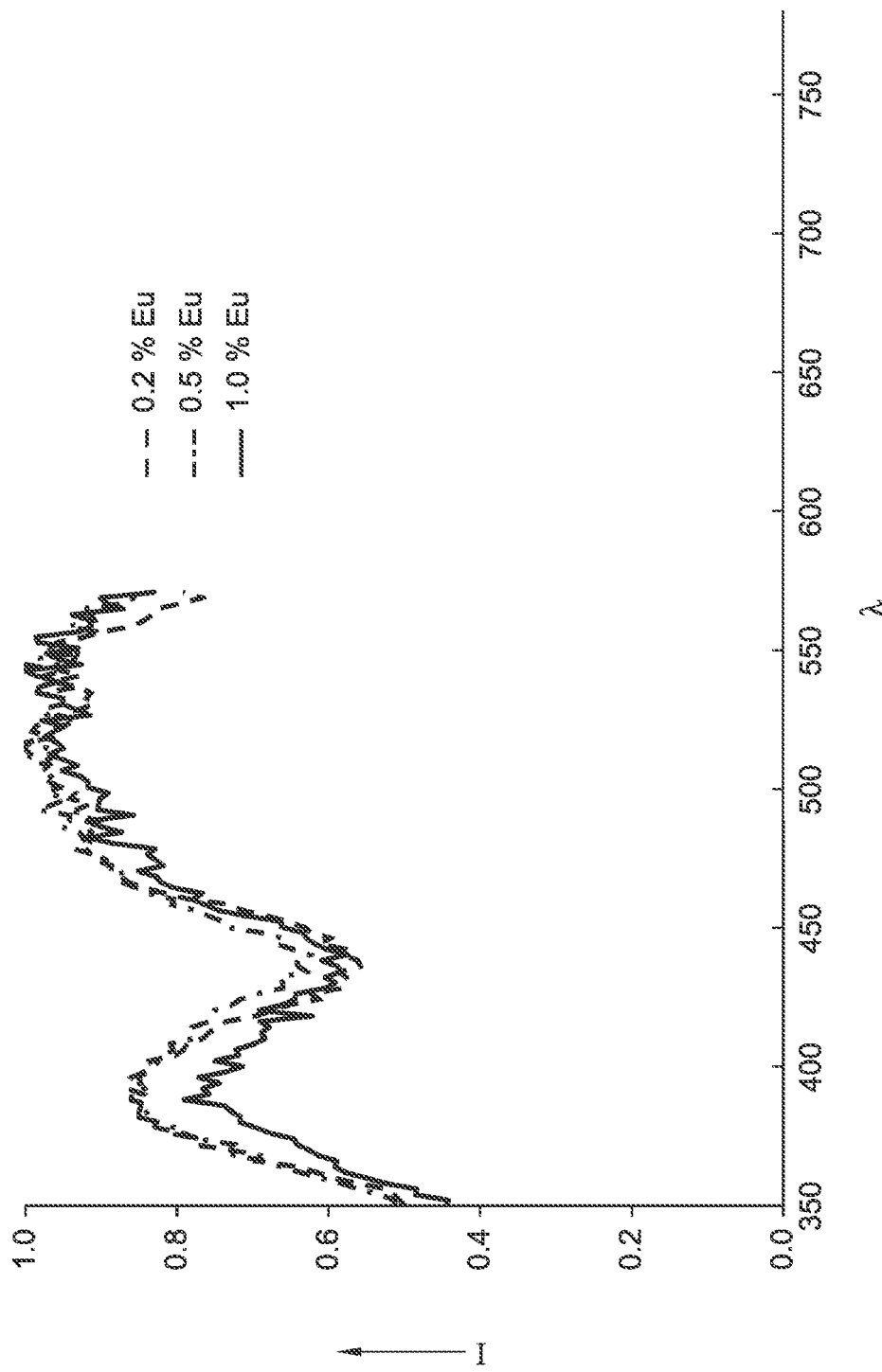
FIGS. 5a-5b shows excitation and emission spectra, respectively, of $Ca_{18.75-x}Li_{10.5}Al_{39}N_{55}:Eu_x$ at different Eu concentrations (the values in the graph are the molar doping levels corresponding to the x values indicated in the description below)
Figure 5B:
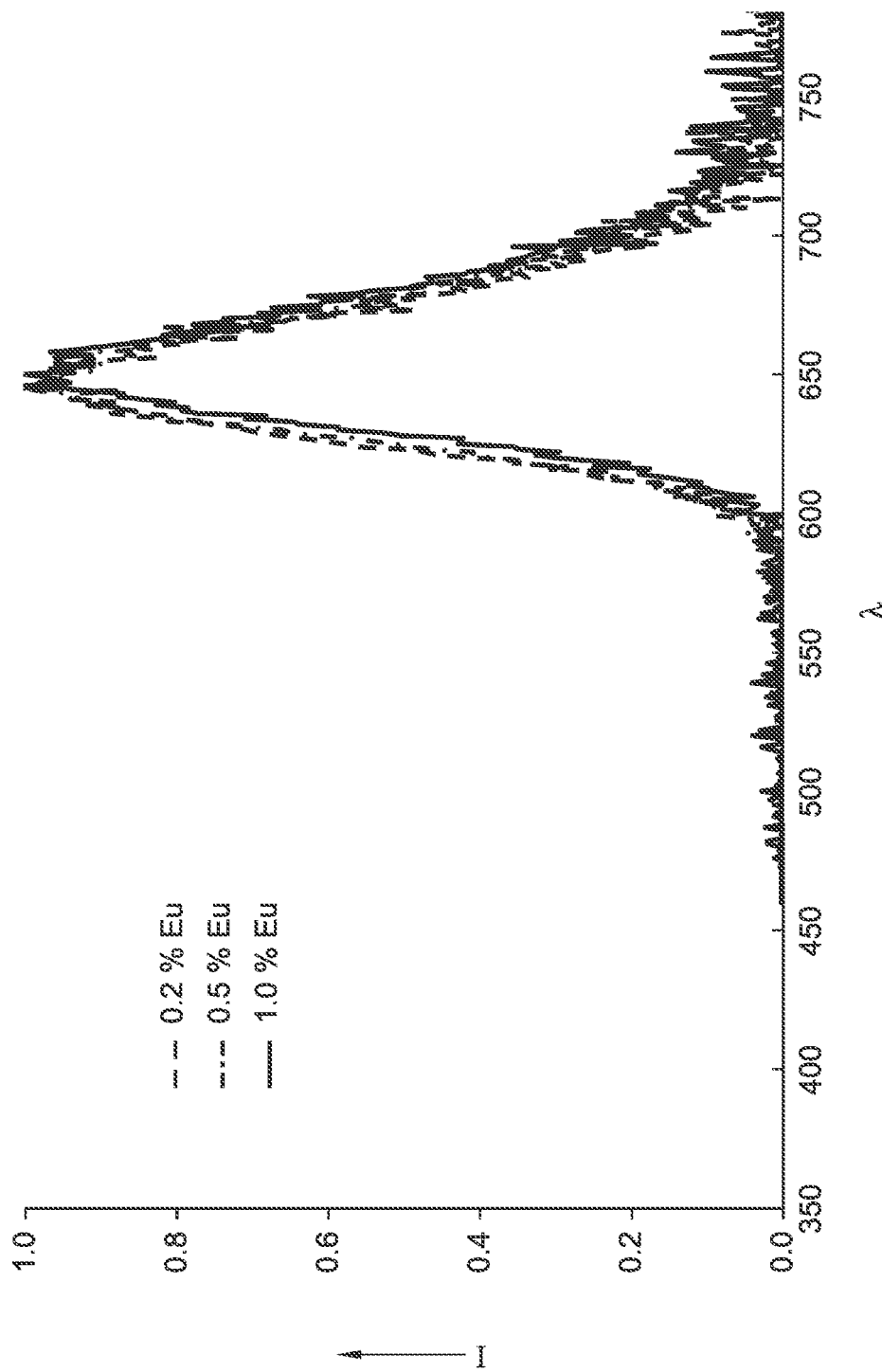

Varying the Eu doping level leads to a slight shift in emission color due to change in emitted light reabsorption. FIG. 5b shows photoluminescence measurement data for $Ca_{18.75-x}Li_{10.5}Al_{39}N_{55}:Eu_x$ (x=0.188, 0.094, 0.038). Lowering the Eu doping level leads to a slight blue shift of the emission band and a decrease in absorption strength in the UV to green spectral range. The excitation maximum is located at ~525 nm in the green spectral range (see FIG. 5a and table 3).

TABLE 3

Emission characteristics as function of the dopin level of divalent Eu

| Doping level/mol % | Emission peak/nm | FWHM/cm$^{-1}$ |
|---|---|---|
| 0.2 | 646 | 1120 |
| 0.5 | 647 | 1140 |
| 1.0 | 650 | 1135 |

To confirm the presence of Li in the structure, EELS measurements were done in a transmission electron microscope (TEM) with an accelerating voltage of 300 kV. The Li—K edge in FIG. 6 occurs at around 56.5 eV and a main peak at 61.6 eV. The Al-$L_{2,3}$ and Al-$L_1$ edges can be seen in the spectrum, but they overlap with the higher energy loss region of the Li—K edge. The Al-$L_{2,3}$ edge shows a maximum peak at 82.6 eV. The values of Li—K and Al-$L_{2,3}$ edges are in good accordance with data known from the literature ($Li_2CaSi_2N_4$ and $Li_2SrSi_2N_4$— A Synthetic Approach to Three-Dimensional Lithium Nitridosilicates, M. Zeuner, S. Pagano, S. Hug, P. Pust, S. Schmiechen, C. Scheu, W. Schnick, Eur. J. Inorg. Chem. 2010, 4945-4951; Near-Edge Structure of Metal-Alumina Interfaces, Scheu, C., et al., Electron Energy-Loss Microsc. Microanal. Microstruct. 6, 19-31, (1995)). The EELS measurements clearly show the presence of Li and Al being integrated in the structure. The EELS data were detected with an energy resolution of about 0.9-1.2 eV as determined by the FWHM of the zero loss peak. Reference O indicates the onset. The data were obtained with a dispersion of 0.3 eV/channel. The acquisition time was 10 s for the Li—K, Al-$L_{2,3}$ and Al-$L_1$ edges. All data were corrected for channel-to-channel gain variation and dark current. The pre-edge background of the Li—K was extrapolated by the use of a 1$^{st}$ order-log-polynomial function and subtracted from the original spectra.

The invention claimed is:

1. A lighting unit comprising a light source, configured to generate light source light and a luminescent material, configured to convert at least part of the light source light into luminescent material light, wherein the luminescent material comprises a phosphor, wherein this phosphor comprises an alkaline earth aluminum nitride based material having a cubic crystal structure with T5 supertetrahedra, wherein the T5 supertetrahedra comprise at least Al and N, and wherein the alkaline earth aluminum nitride based material further comprises a luminescent lanthanide incorporated therein, wherein the alkaline earth aluminum nitride based material comprises

wherein

M comprises one or more selected from the group consisting of Ca, Sr, Mg, Ba; A comprises one or more selected from the group consisting of Li, Na; G comprises one or more selected from the group consisting of Al, Ga, B, wherein G at least comprises Al; Q comprises one or more selected from the group consisting of Mg, Mn, Zn; D comprises one or more selected from the group consisting of Si, Ge; R comprises one or more selected from the group consisting of O, S; ES comprises one or more selected from the group consisting of Eu, Yb, Sm; RE comprises one or more selected from the group consisting of Ce, Pr, Nd, Sm, Eu (III), Gd, Tb, Dy, Ho, Er, Tm; 0<m≤30; 0≤x≤2; 0≤y≤1; 0<x+y≤3; 0<g≤39; 0≤q≤5; 0≤d≤12; 0≤n≤5; 0≤c≤12; 26≤m+a≤30; g+q+d=39; 2(m+q)+3(y+g)+a+4d=165−n+c.

2. The lighting unit according to claim 1, wherein (a) the luminescent lanthanide is selected from the group consisting of Eu (II), Sm, Yb, Ce, Pr, Nd, Sm, Eu (III), Gd, Tb, Dy, Ho, Er, and Tm, and wherein (b) the alkaline earth aluminum nitride based material is of the space Fd-3m.

3. The lighting unit according to claim 1, wherein the T5 supertetrahedra comprise $AlN_4$ tetrahedra.

4. The lighting unit according to claim 1, wherein G=Al.

5. The lighting unit according to claim 1, wherein M comprises one or more of Ca, Sr, and Mg, wherein A comprises Li, wherein G at least comprises Al, wherein Q comprises Mg, wherein D comprises Si, wherein R comprises O, wherein Es comprises Eu, and wherein RE comprises Ce, wherein further x/y<0.1 or y/x<0.1, and wherein d=n=c=0.

6. The lighting unit according to claim 1, wherein the light source comprises a light emitting diode (LED), and wherein the alkaline earth aluminum nitride based material comprises $M_{(20-\delta)}A_{(8+2\delta)}Al_{39}N_{55}:Eu$, with δ in the range of 0-2.

7. The lighting unit according to claim 1, wherein the luminescent material further comprise one or more other phosphors selected from the group consisting of a divalent europium containing nitride luminescent material, a divalent europium containing oxonitride luminescent material, a trivalent cerium containing garnet and a trivalent cerium containing oxonitride, and wherein the light source is configured to generate blue light.

8. A phosphor comprising an alkaline earth aluminum nitride based material having a cubic crystal structure with T5 supertetrahedra, wherein the T5 supertetrahedra comprise at least Al and N, and wherein the alkaline earth aluminum nitride based material further comprises a luminescent lanthanide incorporated therein, wherein the alkaline earth aluminum nitride based material comprises

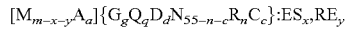

wherein

M comprises one or more selected from the group consisting of Ca, Sr, Mg, Ba; A comprises one or more selected from the group consisting of Li, Na; G comprises one or more selected from the group consisting of Al, Ga, B, wherein G at least comprises Al; Q comprises one or more selected from the group consisting of Mg, Mn, Zn; D comprises one or more selected from the group consisting of Si, Ge; R comprises one or more selected from the group consisting of O, S; ES comprises one or more selected from the group consisting of Eu, Yb, Sm; RE comprises one or more selected from the group consisting of Ce, Pr, Nd, Sm, Eu (III), Gd, Tb, Dy, Ho, Er, Tm; $0<m\leq30$; $0\leq x\leq 2$; $0\leq y\leq 1$; $0<x+y\leq 3$; $0<g\leq 39$; $0\leq q\leq 5$; $0\leq d\leq 12$; $0\leq n\leq 5$; $0\leq c\leq 12$; $26\leq m+a\leq 30$; $g+q+d=39$; $2(m+q)+3(y+g)+a+4d=165-n+c$.

9. The phosphor according to claim 8, wherein (a) the luminescent lanthanide is selected from the group consisting of Eu (II), Sm, Yb, Ce, Pr, Nd, Sm, Eu (III), Gd, Tb, Dy, Ho, Er, and Tm, and wherein (b) the alkaline earth aluminum nitride based material is of the space Fd-3m.

10. The phosphor according to claim 8, wherein the T5 supertetrahedra comprise $AlN_4$ tetrahedra.

11. The phosphor according to claim 8, wherein G=Al.

12. The phosphor according to claim 8, wherein M comprises one or more of Ca, Sr, and Mg, wherein A comprises Li, wherein G at least comprises Al, wherein Q comprises Mg, wherein D comprises Si, wherein R comprises O, wherein Es comprises Eu, and wherein RE comprises Ce, wherein further x/y<0.1 or y/x<0.1, and wherein d=n=c=0.

13. The phosphor according to claim 8, wherein the phosphor comprises phosphor particles having a coating, wherein the coating comprises one or more coating selected from the group consisting of an $AlPO_4$ coating, an $Al_2O_3$ coating and a $SiO_2$ coating.

14. The phosphor according claim 8, wherein the alkaline earth aluminum nitride based material comprises $M_{(20-\delta)}A_{(8+2\delta)}Al_{39}N_{55}$:Eu, with $\delta$ in the range of 0-2.

15. An LCD display device comprising the lighting unit according claim 1 configured as backlighting unit.

* * * * *